(12) United States Patent
Van Santen et al.

(10) Patent No.: US 7,611,348 B2
(45) Date of Patent: Nov. 3, 2009

(54) IMPRINT LITHOGRAPHY

(75) Inventors: Helmar Van Santen, Amsterdam (NL); Aleksey Yurievich Kolesnychenko, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 939 days.

(21) Appl. No.: 11/108,892

(22) Filed: Apr. 19, 2005

(65) Prior Publication Data

US 2006/0231979 A1  Oct. 19, 2006

(51) Int. Cl.
*A01J 21/00*  (2006.01)

(52) U.S. Cl. ............ 425/385; 425/387.1; 425/DIG. 19; 264/319

(58) Field of Classification Search ................. 425/385, 425/388, 387.1, DIG. 19; 264/319
See application file for complete search history.

(56) References Cited

U.S. PATENT DOCUMENTS

| | | | |
|---|---|---|---|
| 4,767,584 A * | 8/1988 | Siler ........................... 425/385 |
| 5,512,131 A | 4/1996 | Kumar et al. ............ 156/655.1 |
| 5,772,905 A | 6/1998 | Chou ........................... 216/44 |
| 5,997,963 A * | 12/1999 | Davison et al. ............. 118/722 |
| 6,165,911 A | 12/2000 | Calveley ..................... 438/754 |
| 6,309,580 B1 | 10/2001 | Chou ........................... 264/338 |
| 6,334,960 B1 | 1/2002 | Willson et al. ................ 216/52 |
| 6,365,059 B1 | 4/2002 | Pechenik ...................... 216/52 |
| 6,375,870 B1 | 4/2002 | Visovsky et al. ........... 264/1.31 |
| 6,482,742 B1 | 11/2002 | Chou |
| 6,518,189 B1 | 2/2003 | Chou ........................... 438/706 |
| 6,656,341 B2 | 12/2003 | Petersson et al. ............. 205/667 |
| 6,696,220 B2 | 2/2004 | Bailey et al. .............. 430/272.1 |
| 6,719,915 B2 | 4/2004 | Willson et al. ................ 216/44 |
| 6,921,615 B2 | 7/2005 | Sreenivasan et al. .......... 430/22 |
| 7,144,539 B2 * | 12/2006 | Olsson ....................... 425/385 |
| 7,150,622 B2 * | 12/2006 | Choi et al. .................. 425/385 |
| 7,462,028 B2 * | 12/2008 | Cherala et al. .............. 425/385 |
| 2002/0093122 A1 | 7/2002 | Choi et al. .................. 264/401 |
| 2002/0094496 A1 | 7/2002 | Choi et al. .................. 430/322 |
| 2002/0132482 A1 | 9/2002 | Chou .......................... 438/692 |
| 2002/0167117 A1 | 11/2002 | Chou .......................... 264/338 |
| 2002/0177319 A1 | 11/2002 | Chou .......................... 438/690 |
| 2003/0034329 A1 | 2/2003 | Chou ........................... 216/44 |
| 2003/0080471 A1 | 5/2003 | Chou .......................... 264/338 |
| 2003/0080472 A1 | 5/2003 | Chou .......................... 264/338 |

(Continued)

FOREIGN PATENT DOCUMENTS

JP       2000-149284 A       5/2000

(Continued)

OTHER PUBLICATIONS

Stephen Y. Chou, et al., "Nanoimprint Lithography", J. Vac. Sci. Technol. B 14(6), Nov./Dec. 1996, pp. 4129-4133.

(Continued)

*Primary Examiner*—Yogendra Gupta
*Assistant Examiner*—Thu Khanh T Nguyen
(74) *Attorney, Agent, or Firm*—Pillsbury Winthrop Shaw Pittman LLP

(57) ABSTRACT

An imprint lithography apparatus is disclosed that has a template holder configured to hold an imprint template and a substrate table, the template holder having a gas bearing configured to supply gas via a high pressure channel and to control a separation distance between the imprint template and a substrate held on the substrate table.

19 Claims, 6 Drawing Sheets

U.S. PATENT DOCUMENTS

| | | | |
|---|---|---|---|
| 2003/0081193 A1 | 5/2003 | White et al. | 355/72 |
| 2003/0127580 A1 | 7/2003 | Ling et al. | 249/115 |
| 2003/0139042 A1 | 7/2003 | Heidari | 438/689 |
| 2003/0141291 A1 | 7/2003 | Heidari et al. | 219/460.1 |
| 2003/0159608 A1 | 8/2003 | Heidari | 101/494 |
| 2003/0170053 A1 | 9/2003 | Montelius et al. | 399/318 |
| 2003/0189273 A1 | 10/2003 | Olsson | 264/293 |
| 2004/0005444 A1 | 1/2004 | Heidari | 428/212 |
| 2004/0009673 A1 | 1/2004 | Sreenivasan et al. | 438/694 |
| 2004/0021866 A1 | 2/2004 | Watts et al. | 356/401 |
| 2004/0022888 A1 | 2/2004 | Sreenivasan et al. | 425/174.4 |
| 2004/0036201 A1 | 2/2004 | Chou et al. | 264/402 |
| 2004/0046288 A1 | 3/2004 | Chou | 264/479 |
| 2004/0081798 A1 | 4/2004 | Lee et al. | 428/141 |
| 2004/0124566 A1 | 7/2004 | Sreenivasan et al. | 264/494 |
| 2004/0149367 A1 | 8/2004 | Olsson et al. | 156/64 |
| 2004/0169003 A1 | 9/2004 | Lee et al. | 216/4 |
| 2004/0192041 A1 | 9/2004 | Jeong et al. | 438/689 |
| 2004/0200411 A1 | 10/2004 | Willson et al. | 118/500 |
| 2004/0209470 A1 | 10/2004 | Bajorek | 438/689 |
| 2004/0219249 A1 | 11/2004 | Chung et al. | 425/385 |
| 2004/0219461 A1 | 11/2004 | Chung et al. | 430/311 |
| 2005/0039618 A1 | 2/2005 | Heidari et al. | 101/368 |
| 2005/0064054 A1 | 3/2005 | Kasumi | 425/112 |

FOREIGN PATENT DOCUMENTS

| | | |
|---|---|---|
| JP | 2003-109915 A | 4/2003 |
| WO | WO 01/79591 A1 | 10/2001 |
| WO | WO 01/79592 A1 | 10/2001 |

OTHER PUBLICATIONS

English translation of Official Action issued on Apr. 28, 2009 in Japanese Application No. 2006-114629.

* cited by examiner

"PRIOR ART"

"PRIOR ART"

"PRIOR ART"

"PRIOR ART"

"PRIOR ART"

IMPRINT LITHOGRAPHY

FIELD

The present invention relates to imprint lithography.

BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using light of shorter wavelength. However, there are problems associated with such reductions. Current systems are starting to adopt optical sources with wavelengths in the 193 nm regime but even at this level, diffraction limitations become a barrier. At lower wavelengths, the transparency of materials is very poor. Optical lithography machines capable of enhanced resolutions require complex optics and rare materials and are consequently very expensive.

An alternative for printing sub-100 nm features, known as imprint lithography, comprises transferring a pattern to a substrate by imprinting a pattern into an imprintable medium using a physical mould or template. The imprintable medium may be the substrate or a material coated on to a surface of the substrate. The imprintable medium may be functional or may be used as a "mask" to transfer a pattern to an underlying surface. The imprintable medium may, for instance, be provided as a resist deposited on a substrate, such as a semiconductor material, into which the pattern defined by the template is to be transferred. Imprint lithography is thus essentially a moulding process on a micrometer or nanometer scale in which the topography of a template defines the pattern created on a substrate. Patterns may be layered as with optical lithography processes so that, in principle, imprint lithography could be used for such applications as IC manufacture.

The resolution of imprint lithography is limited only by the resolution of the template fabrication process. For instance, imprint lithography may be used to produce features in the sub-50 nm range with significantly improved resolution and line edge roughness compared to that achievable with conventional optical lithography processes. In addition, imprint processes do not require expensive optics, advanced illumination sources or specialized resist materials typically required by optical lithography processes.

In a conventional imprint lithography apparatus, a template provided with a pattern is attached to an actuator. The actuator moves the template towards a substrate, and pushes the template into the substrate or an imprintable medium on the substrate. The forces pushing into the substrate via the template may be very large causing deformation of the substrate and/or template. Such deformation may be, for example, a few hundred nanometers, which may lead to damage of the pattern imprinted onto the substrate.

SUMMARY

According to an aspect of the invention, there is provided an imprint lithography apparatus comprising a template holder configured to hold an imprint template and a substrate table, the template holder having a gas bearing configured to supply gas via a high pressure channel and to control a separation distance between the imprint template and a substrate held on the substrate table.

According to another aspect of the invention, there is provided a method of imprint lithography comprising moving an imprint template using a gas bearing between an imprint position in which the imprint template applies a pattern to imprintable material on a substrate, and a disengaged position in which the imprint template does not apply a pattern to the imprintable material.

According to a further aspect of the invention, there is provided a template holder configured to hold an imprint lithography template, the template holder comprising a gas bearing arranged to supply gas via a high pressure channel and to control a separation distance between the imprint template and a substrate held on a substrate table.

An embodiment of the invention is applicable to any imprint lithography process in which a patterned template is imprinted into an imprintable medium in a flowable state, and may be applied, for instance, to hot and/or UV imprint lithography as described herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

There are two principal approaches to imprint lithography which will be termed generally as hot imprint lithography and UV imprint lithography. There is also a third type of "printing" lithography known as soft lithography. Examples of these are illustrated in FIGS. 1a to 1c.

Figure 1A:
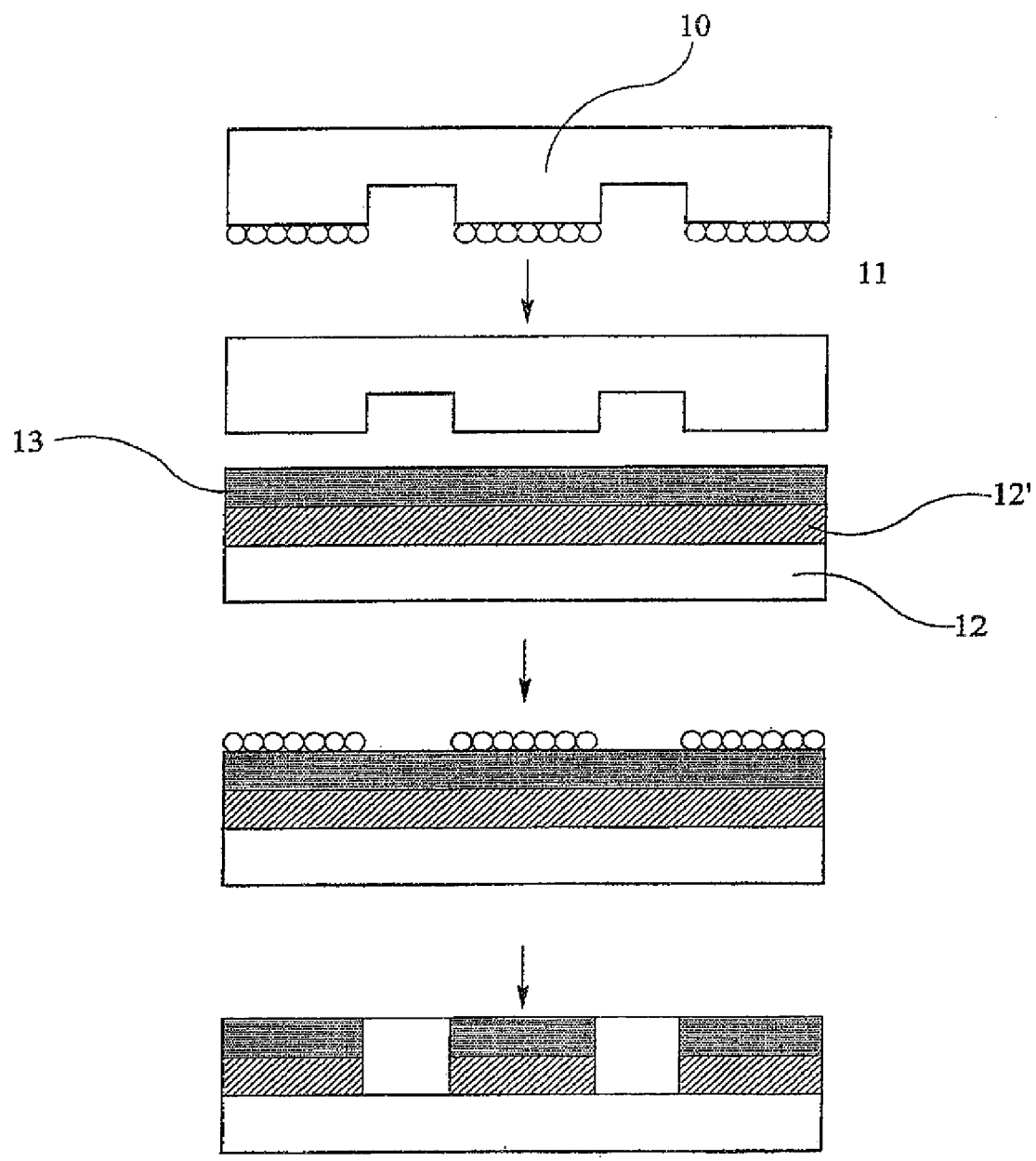
FIG. 1a-1c illustrate examples of conventional soft, hot and UV lithography process respectively.
Figure 1B:
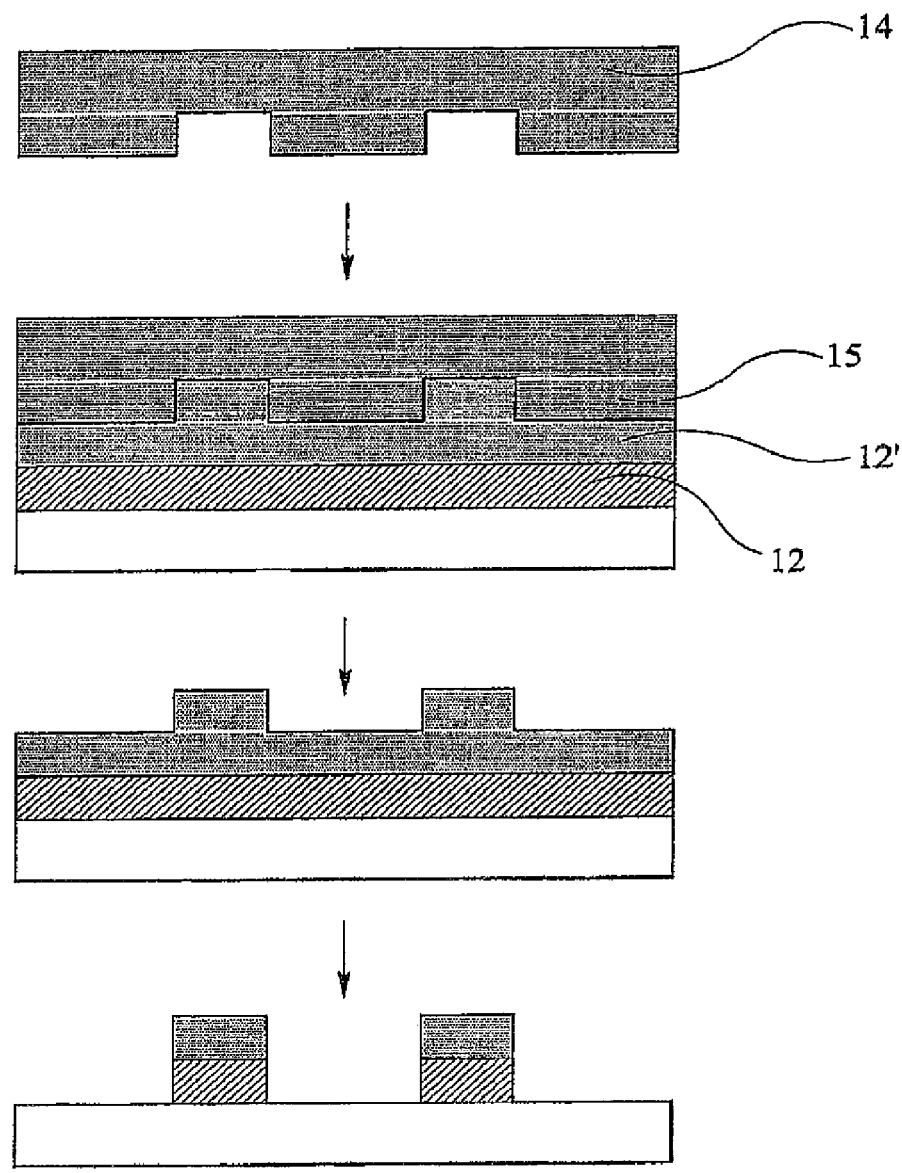
Figure 1C:
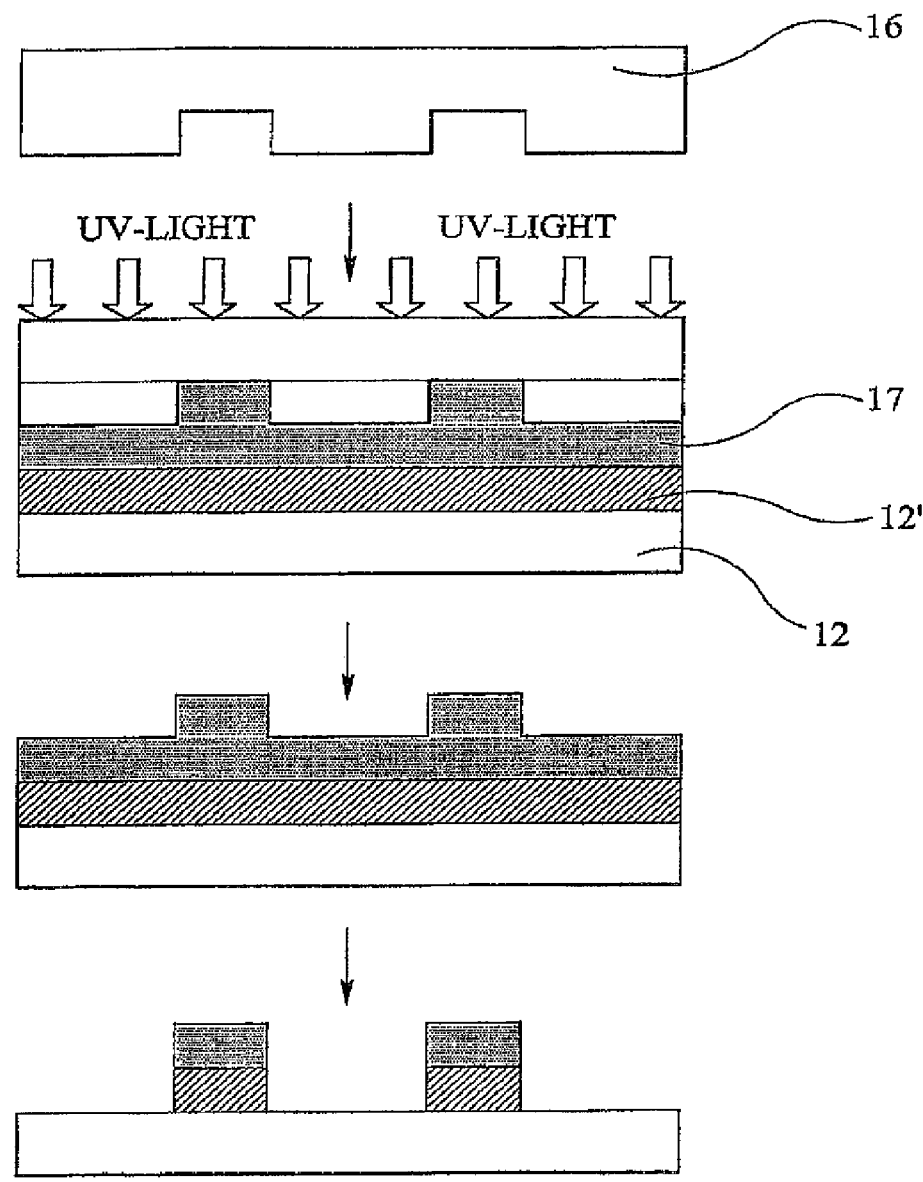

FIG. 1a schematically depicts the soft lithography process which involves transferring a layer of molecules 11 (typically an ink such as a thiol) from a flexible template 10 (typically fabricated from polydimethylsiloxane (PDMS)) onto a resist layer 13 which is supported upon a substrate 12 and planarization and transfer layer 12'. The template 10 has a pattern of features on its surface, the molecular layer being disposed upon the features. When the template is pressed against the resist layer, the layer of molecules 11 stick to the resist. Upon removal of the template from the resist, the layer of molecules 11 stick to the resist, the residual layer of resist is etched such that the areas of the resist not covered by the transferred molecular layer are etched down to the substrate.

The template used in soft lithography may be easily deformed and may therefore not be suited to high resolution applications, e.g. on a nanometer scale, since the deformation of the template may adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses a harder template made from, for example, silicon or nickel, which are more resistant to wear and deformation. This is described for instance in U.S. Pat. No. 6,482,742 and illustrated in FIG. 1b. In a typical hot imprint process, a solid template 14 is imprinted into a thermosetting or a thermoplastic polymer resin 15, which has been cast on the surface of substrate. The resin may, for instance, be spin coated and baked onto the substrate surface or more typically (as in the example illustrated) onto a planarization and transfer layer 12'. It should be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used, the resin is heated to a temperature such that, upon contact with the template, the resin is sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated so that it is in a freely flowable state immediately prior to imprinting with the template. It is typically necessary to heat thermoplastic resin to a temperature considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin which may then be removed by an appropriate etch process to leave only the pattern features.

Figure 2:
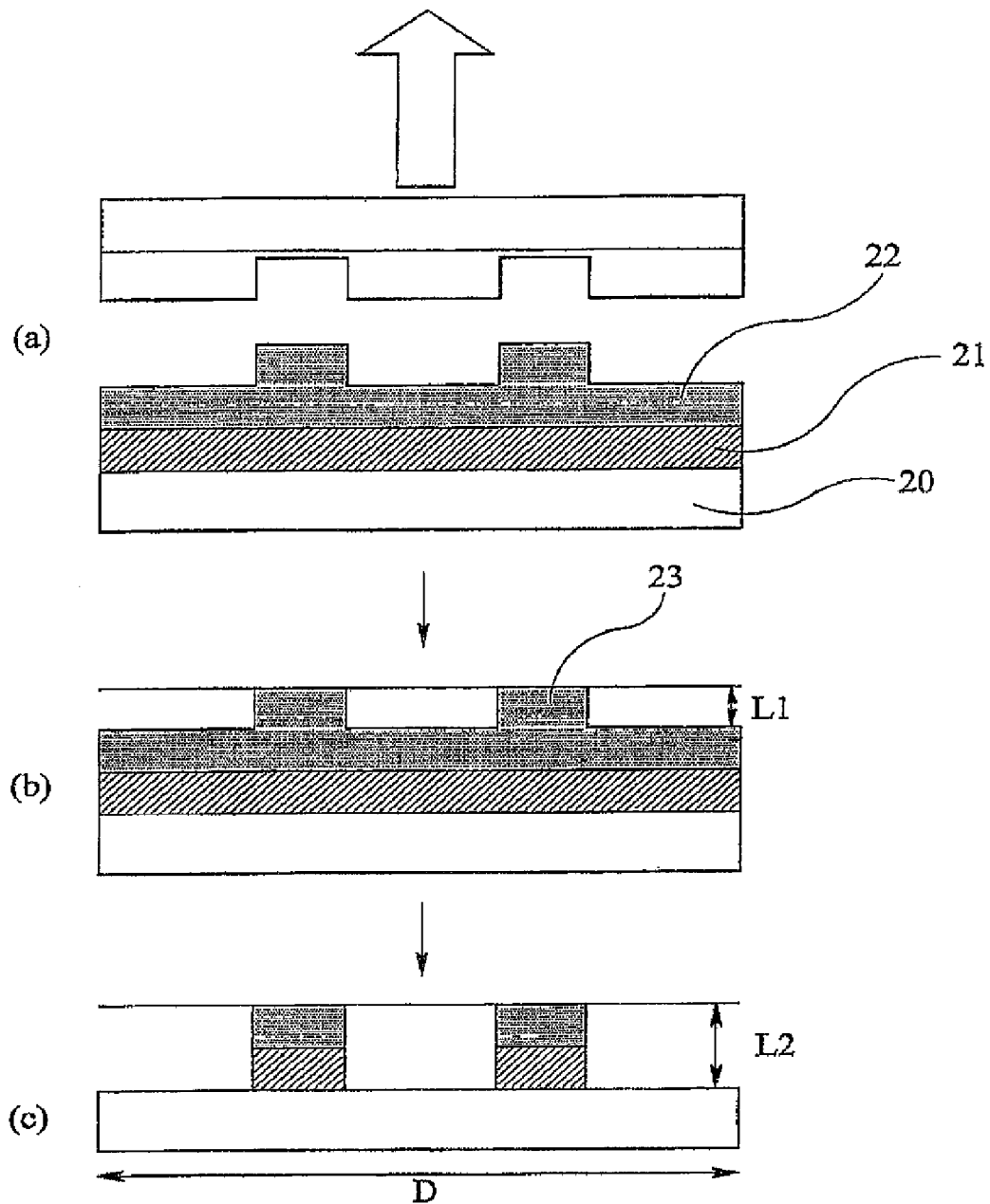
FIG. 2 illustrates a two step etching process employed when hot and UV imprint lithography is used to pattern a resist layer.

Upon removal of the template from the solidified resin, a two-step etching process is typically performed as illustrated in FIGS. 2a to 2c. The substrate 20 has a planarization and transfer layer 21 immediately upon it, as shown in FIG. 2a. The purpose of the planarization and transfer layer is twofold. It acts to provide a surface substantially parallel to that of the template, which helps ensure that the contact between the template and the resin is parallel, and also to improve the aspect ratio of the printed features, as described herein.

After the template has been removed, a residual layer 22 of the solidified resin is left on the planarization and transfer layer 21, shaped in the desired pattern. The first etch is isotropic and removes parts of the residual layer 22, resulting in a poor aspect ratio of features where L1 is the height of the features 23, as shown in FIG. 2b. The second etch is anisotropic (or selective) and improves the aspect ratio. The anisotropic etch removes those parts of the planarization and transfer layer 21 which are not covered by the solidified resin, increasing the aspect ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only must the pattern transfer be performed at a higher temperature, but also relatively large temperature differentials might be required in order to ensure the resin is adequately solidified before the template is removed. Temperature differentials between 35 and 100° C. may be needed. Differential thermal expansion between, for instance, the substrate and template may then lead to distortion in the transferred pattern. This may be exacerbated by the relatively high pressure required for the imprinting step, due the viscous nature of the imprintable material, which can induce mechanical deformation in the substrate, again distorting the pattern.

UV imprint lithography, on the other hand, does not involve such high temperatures and temperature changes nor does it require such viscous imprintable materials. Rather, UV imprint lithography involves the use of a partially or wholly transparent template and a UV-curable liquid, typically a monomer such as an acrylate or methacrylate. In general, any photopolymerizable material could be used, such as a mixture of monomers and an initiator. The curable liquid may also, for instance, include a dimethyl siloxane derivative. Such materials are less viscous than the thermosetting and thermoplastic resins used in hot imprint lithography and consequently move much faster to fill template pattern features. Low temperature and low pressure operation also favors higher throughput capabilities.

An example of a UV imprint process is illustrated in FIG. 1c. A quartz template 16 is applied to a UV curable resin 17 in a similar manner to the process of FIG. 1b. Instead of raising the temperature as in hot embossing employing thermosetting resins, or temperature cycling when using thermoplastic resins, UV radiation is applied to the resin through the quartz template in order to polymerize and thus cure it. Upon removal of the template, the remaining steps of etching the residual layer of resist are the same or similar as for the hot embossing process described herein. The UV curable resins typically used have a much lower viscosity than typical thermoplastic resins so that lower imprint pressures can be used. Reduced physical deformation due to the lower pressures, together with reduced deformation due to high temperatures and temperature changes, makes UV imprint lithography suited to applications requiring high overlay accuracy. In addition, the transparent nature of UV imprint templates can accommodate optical alignment techniques simultaneously to the imprinting.

Although this type of imprint lithography mainly uses UV curable materials, and is thus generically referred to as UV imprint lithography, other wavelengths of radiation may be used to cure appropriately selected materials (e.g., activate a polymerization or cross linking reaction). In general, any radiation capable of initiating such a chemical reaction may be used if an appropriate imprintable material is available. Alternative "activating radiation" may, for instance, include visible light, infrared radiation, x-ray radiation and electron beam radiation. In the general description herein, references to UV imprint lithography and use of UV radiation are not intended to exclude these and other activating radiation possibilities.

As an alternative to imprint systems using a planar template which is maintained substantially parallel to the substrate surface, roller imprint systems have been developed. Both hot and UV roller imprint systems have been proposed in which the template is formed on a roller but otherwise the imprint process is very similar to imprinting using a planar template. Unless the context requires otherwise, references to an imprint template include references to a roller template.

There is a particular development of UV imprint technology known as step and flash imprint lithography (SFIL) which may be used to pattern a substrate in small steps in a similar manner to optical steppers conventionally used, for example, in IC manufacture. This involves printing small areas of the substrate at a time by imprinting a template into a UV curable resin, 'flashing' UV radiation through the template to cure the resin beneath the template, removing the template, stepping to an adjacent region of the substrate and repeating the operation. The small field size of such step and repeat processes may help reduce pattern distortions and CD variations so that SFIL may be particularly suited to manufacture of IC and other devices requiring high overlay accuracy.

Although in principle the UV curable resin can be applied to the entire substrate surface, for instance by spin coating, this may be problematic due to the volatile nature of UV curable resins.

One approach to addressing this problem is the so-called 'drop on demand' process in which the resin is dispensed onto a target portion of the substrate in droplets immediately prior to imprinting with the template. The liquid dispensing is controlled so that a predetermined volume of liquid is deposited on a particular target portion of the substrate. The liquid may be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features while at the same time minimizing excess resin which can be rolled to an undesirably thick or uneven residual layer since as soon as neighboring drops touch the resin will have nowhere to flow.

Although reference is made herein to depositing UV curable liquids onto a substrate, the liquids could also be deposited on the template and in general the same techniques and considerations will apply.

Figure 3:
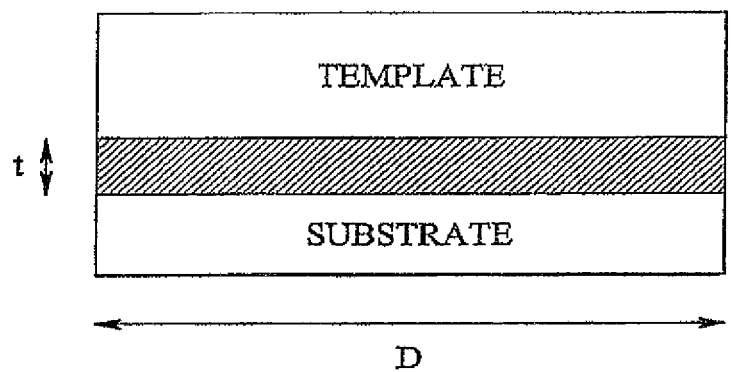
FIG. 3 schematically illustrates an imprint template and a typical imprintable resist layer deposited on a substrate.

FIG. 3 illustrates the relative dimensions of the template, imprintable material (curable monomer, thermosetting resin, thermoplastic, etc) and substrate. The ratio of the width of the substrate, D, to the thickness of the curable resin layer, t, is of the order of $10^6$. It will be appreciated that, in order to avoid the features projecting from the template damaging the substrate, the dimension t should be greater than the depth of the projecting features on the template.

The residual layer left after stamping is useful in protecting the underlying substrate, but as mentioned herein it may also be the source of a problem, particularly when high resolution and/or overlay accuracy is required. The first 'breakthrough' etch is isotropic (non-selective) and will thus to some extent erode the features imprinted as well as the residual layer. This may be exacerbated if the residual layer is overly thick and/or uneven. This problem may, for instance, lead to variation in the thickness of lines ultimately formed in the underlying substrate (i.e. variation in the critical dimension). The uniformity of the thickness of a line that is etched in the transfer layer in the second anisotropic etch is dependant upon the aspect ratio and integrity of the shape of the feature left in the resin. If the residual resin layer is uneven, then the non-selective first etch can leave some of these features with "rounded" tops so that they are not sufficiently well defined to ensure good uniformity of line thickness in the second and any subsequent etch process. In principle, the above problem may be reduced by ensuring the residual layer is as thin as possible but this can require application of undesirably large pressures (possibly increasing substrate deformation) and relatively long imprinting times (possibly reducing throughput).

The template is a significant component of the imprint lithography system. As noted herein, the resolution of the features on the template surface is a limiting factor on the attainable resolution of features printed on the substrate. The templates used for hot and UV lithography are generally formed in a two-stage process. Initially, the required pattern is written using, for example, electron beam writing, to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used. Generally, a technique capable of very high resolution will be used as the template is effectively a 1× mask with the resolution of the transferred pattern being limited by the resolution of the pattern on the template.

The release characteristics of the template may also be a consideration. The template may, for instance, be treated with a surface treatment material to form a thin release layer on the template having a low surface energy (a thin release layer may also be deposited on the substrate).

Another consideration in the development of imprint lithography is the mechanical durability of the template. The template may be subjected to large forces during stamping of the resist, and in the case of hot lithography, may also be subjected to extremes of pressure and temperature. This may cause wearing of the template, and may adversely affect the shape of the pattern imprinted upon the substrate.

In hot imprint lithography, there is a potential advantage in using a template of the same or similar material to the substrate to be patterned in order to reduce differential thermal expansion between the two. In UV imprint lithography, the template is at least partially transparent to the activation radiation and accordingly quartz templates are used.

Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disc magnetic media, flat panel displays, thin-film magnetic heads, etc.

While in the description herein, particular reference has been made to the use of imprint lithography to transfer a template pattern to a substrate via an imprintable resin effectively acting as a resist, in some circumstances the imprintable material may itself be a functional material, for instance having a functionally such as conductivity, optical linear or non-linear response, etc. For example, the functional material may form a conductive layer, a semi-conductive layer, a dielectric layer or a layer having another desirable mechanical, electrical or optical property. Some organic substances may also be appropriate functional materials. Such applications may be within the scope of the present invention.

Figure 4:
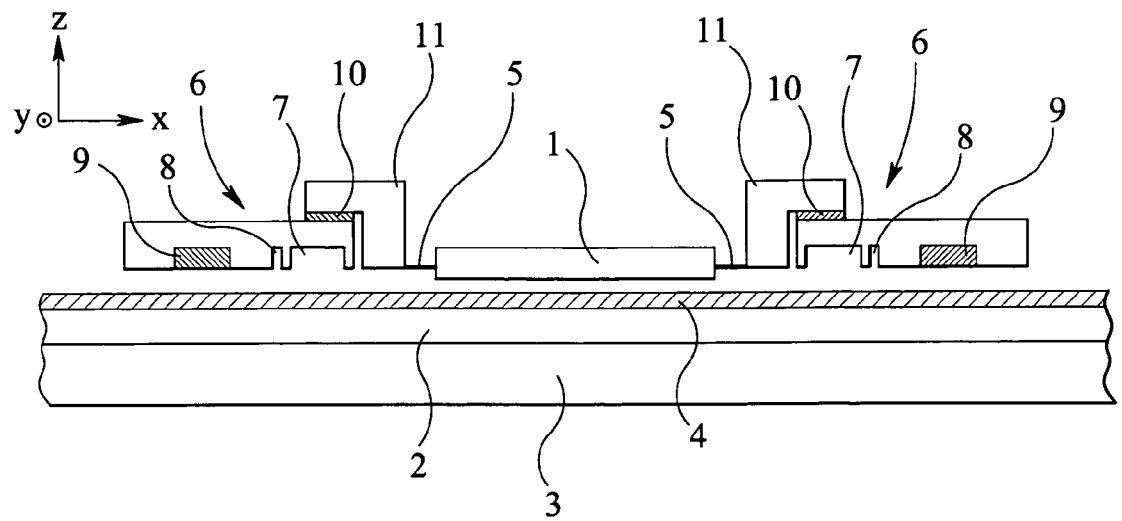
FIG. 4 schematically shows an imprint template actuator of an imprint apparatus according to an embodiment of the invention.

FIG. 4 is a cross-section of an embodiment of the invention that shows an imprint template 1 located a short distance away from a substrate 2 held on a substrate table 3. The substrate 2 is covered with a layer of imprintable material 4. Although the layer of imprintable material 4 is shown as a single layer deposited directly on the substrate 2, it will be appreciated that in practice there is likely to be a transfer layer between the imprintable material 4 and the substrate 2. The transfer layer is not directly relevant to the description herein and is omitted from the description hereafter for simplicity.

The imprint template 1 is connected via one or more plate springs 5 to a template holder generally indicated as 6. The template holder 6 comprises a gas (e.g., air) bearing, and will hereafter be referred to as gas bearing 6. The gas bearing 6 has a low pressure channel 7, a neutral channel 8, and a high pressure porous channel 9. The low pressure channel 7 is located closest to the imprint template 1, and the high pressure porous channel 9 is located furthest from the imprint template 1. The neutral channel 8 is located between the low pressure channel 7 and the high pressure porous channel 9. The gas bearing is connected via one or more piezo actuators 10 to a flange 11 which is connected via the plate spring(s) 5 to the imprint template 1.

It will be understood that when FIG. 4 is viewed from the Z-direction, the mask is rectangular in shape, and that the low pressure channel 7, neutral channel 8, and high pressure porous channel 9 of the gas bearing 6 each substantially encompass the imprint template 1. The channels may be in the form of circles, rectangles, or any other suitable continuous or substantially continuous shape. In an embodiment, substantially encompass also means that the gas bearing is provided not continuously around the template 1 but rather at discrete points around the periphery of the template 1.

In an embodiment, the gas bearing is of the type that is sometimes referred to as a preloaded gas bearing. This means that the low pressure channel 7 is used to apply a low pressure in the area located under a lowermost surface of the imprint template 1, with the effect that ambient pressure (typically atmospheric pressure) above the imprint template 1 pushes the imprint template downwards in the Z-direction (there is a pressure differential between the upper and lower surfaces of the imprint template). The downward force caused by the pressure differential is balanced by an upwards force generated by high pressure gas flowing out of the high pressure porous channel 9. The separation distance between the imprint template 1 and the substrate 2 is determined by the relative forces applied as a consequence of the low pressure generated by the low pressure channel 7 and the gas pressure generated by the high pressure porous channel 9. There will be an equilibrium position in which the upwards force and the downwards force acting on the imprint template 1 are equal, and the imprint template will automatically move to this equilibrium position.

The purpose of the neutral channel 8 is to make it easier to achieve a large pressure difference between the low pressure channel 7 and the high pressure porous channel 9. In the absence of a neutral channel, high pressure gas from the high pressure porous channel 9 will tend to leak into the low pressure channel 7, thereby reducing the pressure difference between them. The neutral channel is typically pressurized to a relatively low pressure (i.e. close to atmospheric pressure) to provide a buffer between the high pressure porous channel 9 and the low pressure channel 7, thereby allowing a high pressure difference to be achieved.

Intuitively, it can be understood that if the pressure of gas flowing from the high pressure porous channel 9 is reduced and the low pressure from the low pressure channel 7 is unchanged, then the imprint template 1 will move closer to the substrate 2 (the equilibrium position is now closer to the substrate 2). Conversely, if the gas pressure from the high pressure porous channel 9 is increased and the low pressure from the low pressure channel 7 is unchanged, then the imprint template will move away from the substrate 2 (the equilibrium position is now further away from the substrate 2). In this way the separation distance between the imprint template 1 and the substrate 2 can be controlled. Similarly, the imprint template 1 may be moved by changing the low pressure generated by the low pressure channel 7 while keeping the gas pressure from the high pressure porous channel 9 constant. Of course, both the low pressure generated by the low pressure channel 7 and the gas pressure from the high pressure porous channel 9 may be changed appropriately to effect movement of the template 1. In a typical arrangement, however, it is the low pressure that is kept constant, and the gas pressure is varied. This is because when the low pressure between the imprint template 1 and the substrate 2 is constant, the evaporation rate of imprintable material may stay constant and therefore may be anticipated and corrected for.

In use, the low pressure is set to a certain level, and the high pressure gas delivered from the high pressure porous channel 9 is set at a high value so that the imprint template 1 is raised to a clearance position above the substrate 2 (referred to herein as the disengaged position). The substrate table 3 is moved in the X and/or Y directions until the imprint template 1 is located above an area of the substrate 2 onto which a pattern is to be imprinted. The pressure of the gas provided through the high pressure porous channel 9 is then reduced to a certain value, so that the imprint template moves downwards toward the substrate 2, thereby imprinting a pattern into the imprintable material 4 located on the substrate 2 (referred to herein as the imprint position). The pressure of gas provided through the high pressure porous channel 9, to move the imprint template 1 to the imprint position, is selected so that the equilibrium position of the imprint template 1 corresponds precisely to the desired separation between the imprint template 1 and the substrate 2. The desired separation in general depends upon the feature size of the pattern on the template 1, and is typically equal to or double the feature size. In an implementation, the separation distance may be between 50 and 200 nm.

The imprint template 1 remains in the imprint position for a period of time, which is calculated to allow the imprintable material 4 to flow fully into recesses which form the pattern on the template. This period of time may also allow for illumination of the imprintable material with UV light (for so called UV imprint lithography). Once this period of time has elapsed, the imprint template 1 is raised from the substrate 2 to the disengaged position by increasing the pressure of gas provided through the high pressure porous channel 9.

In an embodiment, when the imprint template 1 is in the engaged position, the sum of forces being applied to the substrate 2 is substantially zero. This is different from a conventional imprint apparatus in which a downward force is continuously applied to the imprint template and the substrate, possibly leading to deformation problems.

Although the net force applied by the gas bearing to the substrate 2 is substantially zero, the 'stiffness' of the gas bearing is such that it would be very difficult to move the imprint template 1 away from the imprint position (the force needed to push the imprint template 1 away from its equilibrium position increases as $z^3$ with distance). This means that the imprint template 1 is securely held at the imprint position.

In addition that the net force applied to the substrate is substantially zero, the position at which the forces act against one another, i.e. between the low pressure channel 7 and the high pressure porous channel 9, is located well outside of the imprint template 1 and so does not cause deformation of the imprint template 1 or of the substrate 2 in the area which is being imprinted. This is advantageous compared to a conventional imprint apparatus in which forces may be applied directly onto the area of the substrate onto which the pattern is being imprinted or onto the template, leading to deformation problems.

Figure 5:
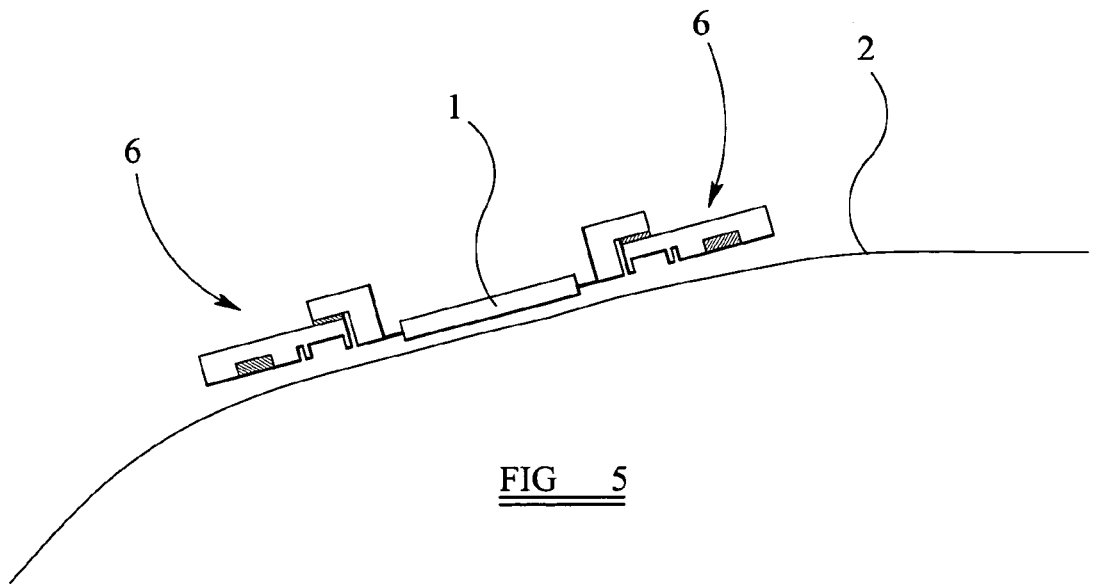
FIG. 5 schematically shows the imprint template actuator of FIG. 4 in use on a substrate depicted with an uneven topography.

Furthermore, the gas bearing can automatically follow the topography of the substrate. This is illustrated schematically in FIG. 5, where an imprint template 1 carried by a gas bearing 6 is in the imprint position on a substrate 2 (the layer of imprintable material 4 and the substrate table 3 are omitted for ease of illustration). Although the substrate 2 is uneven, the gas bearing 6 can automatically move the imprint template 1 to within a certain distance from the substrate surface, automatically compensating for the irregular topography of the surface of the substrate 2. This means that optimal separation between the imprint template 1 and the substrate 2 may be automatically achieved.

However, in some instances, the gas bearing 6 may not be able to fully correct for substrate topography variation, for example, if the spatial frequency of the substrate topography is equal to or a little smaller than the size of the gas bearing. Where this occurs the plate spring(s) 5, which give some flexibility to the template during imprint, may provide some correction to the orientation of the template 1. The piezo actuator(s) 10 may also be used to correct the orientation of the template 1. It will be appreciated that it is not necessary to include both the plate spring(s) 5 and the piezo actuator(s) 10 in the connection between the template 1 and the gas bearing 6, and one or the other may be sufficient. Indeed, in some instances neither may be needed.

In an embodiment, the low pressure channel 7 is provided closest to the imprint template 1 so that the area beneath the imprint template is under low pressure. This is advantageous as it reduces the likelihood of contamination of the imprintable material by gases. It will be appreciated that, as is conventional for gas bearings, the positions of the high pressure porous channel 9 and the low pressure channel 7 may be swapped. Where this is done, high pressure is provided between the imprint template 1 and the substrate 2. If evaporation of imprintable material is an issue, then the high pressure gas may be arranged to include imprintable material vapor at saturation pressure, thereby possibly decreasing the rate of evaporation of the imprintable material.

An opening (not shown) may be provided, for example at or adjacent to an edge of the template 1. The opening may be connected to a source of gas, which may be used to adjust the pressure underneath the template 1. This is possible because the distance from the gas bearing 6 to the template 1 may be significant and narrow in the Z-direction, so that there may be a pressure difference between the area under the template 1 and the low pressure channel 7. The opening may in some instances be connected to a low pressure pump instead of a source of gas. This allows the pressure under the template 1 to be decreased as well as increased. The opening may be used in this way irrespective of whether the low pressure channel 7 is closest to the template 1 or the high pressure porous channel 9 is closest to the template 1.

Any suitable gas or gases may be passed through the high pressure porous channel 7, the neutral channel 8, and/or the opening, including, for example, nitrogen or helium (which may be preferred over air or oxygen because oxygen may be harmful for polymerization). Further, it is not necessary that the high pressure channel be porous, i.e. that the high pressure gas is distributed via a porous material. The high pressure channel could instead, for example, comprise a suitably dimensioned slot. However, in an embodiment, a high pressure porous channel is preferred over a slot because it spreads the gas pressure over a larger area. By spreading the gas pressure over a larger area, the high pressure porous channel may avoid damaging the imprintable material on the substrate, which might occur if the high pressure gas were channeled through a slot.

An imprintable material dispenser (not shown) may be located adjacent to the template 1. The imprintable material dispenser would typically be located ahead of the template 1 in the Y-direction (i.e. the scanning direction), so that imprintable material may be deposited immediately prior to imprinting taking place. This may be advantageous because at least some of the gas bearing may be supported by the transfer layer instead of the imprintable material, the transfer layer typically being stiffer than the imprintable material.

The description herein has used words such as 'down', 'upper', 'lower', etc. It will be appreciated that these are to be understood in the context of the Z-direction as shown in FIG. 4. These terms are not intended to limit the invention to only be applied in a particular orientation, and it will be understood by those skilled in the art that one or more embodiments of the invention may be implemented with other orientations.

The term 'high pressure' in the above description is intended to mean a pressure which is greater than the ambient pressure. Similarly, the term 'low pressure' in the above description is intended to mean a pressure which is lower than the ambient pressure.

The term 'disengaged position' in the above description is intended to mean that the imprint template 1 is sufficiently far above the substrate 2 that it does not apply a pattern to the imprintable material 4. In most instances, this will mean that the imprint template 1 is not in contact with the imprintable material 4. However, it might be the case that there remains a small amount of residual contact between the imprint template 1 and the imprintable material 4 when the imprint template 1 is in the disengaged position.

In the above description it has been mentioned that the one or more piezo actuators 10 may be used to correct the orientation of the template 1. The piezo actuator(s) 10 may alternatively or additionally be used to move the template 1 in the X and Y directions to align the template with the substrate 2. Typically, independent piezo actuators are needed for each degree of freedom of movement.

While specific examples of the invention have been described above, it will be appreciated that the present invention may be practiced otherwise than as described. The description is not intended to limit the invention.

The invention claimed is:

1. An imprint lithography apparatus comprising a template holder configured to hold an imprint template and a substrate table, the template holder having a gas bearing configured to supply gas via a high pressure channel and to control a separation distance between the imprint template and a substrate held on the substrate table.

2. The apparatus according to claim 1, wherein the gas bearing is preloaded by a channel arranged to apply a low pressure.

3. The apparatus according to claim 2, wherein the low pressure channel is located adjacent to and encompasses the imprint template when held by the template holder such that the low pressure extends across a lowermost surface of the imprint template.

4. The apparatus according to claim 1, wherein the high pressure channel is located adjacent to and encompasses the imprint template when held by the template holder such that high pressure gas extends across a lowermost surface of the imprint template.

5. The apparatus according to claim 1, wherein the high pressure channel is porous.

6. The apparatus according to claim 1, wherein the template holder comprises a plate spring to hold an imprint template.

7. The apparatus according to claim 1, wherein the template holder comprises a piezo actuator configured to be connected to an imprint template.

8. The apparatus according to claim 1, wherein the gas bearing is controllable to move the imprint template when held by the template holder between an imprint position in which the imprint template applies a pattern to imprintable material on the substrate, and a disengaged position in which the imprint template does not apply a pattern to the imprintable material.

9. The apparatus according to claim 1, comprising a dispenser of imprintable material located adjacent to the imprint template when held by the template holder.

10. A template holder configured to hold an imprint lithography template, the template holder comprising a gas bearing arranged to supply gas via a high pressure channel and to control a separation distance between the imprint template and a substrate held on a substrate table.

11. The template holder of claim 10, further comprising a low pressure channel located adjacent to and encompassing the imprint template when held by the template holder such that the low pressure extends across a lowermost surface of the imprint template.

12. The template holder of claim 10, wherein the high pressure channel is porous.

13. The template holder of claim 10, wherein the template holder comprises a piezo actuator configured to be connected to an imprint template.

14. The template holder of claim 10, further comprising an opening in the template holder adjacent to the template when held by the template holder or between the template holder and the template when held by the template holder, the opening configured to remove or supply gas to allow for adjustment of pressure beneath the template.

15. An imprint lithography apparatus comprising:
   a substrate table; and
   a template holder configured to hold an imprint template, the template holder having a gas bearing configured to supply gas via a high pressure channel and to control a separation distance between the imprint template and a substrate held on the substrate table, and the template holder having an opening adjacent to the template when held by the template holder or between the template holder and the template when held by the template holder, the opening configured to remove or supply gas to allow for adjustment of pressure beneath the template.

16. The apparatus according to claim 15, wherein the gas bearing is preloaded by a channel arranged to apply a low pressure.

17. The apparatus according to claim 16, wherein the low pressure channel is located adjacent to and encompasses the imprint template when held by the template holder such that the low pressure extends across a lowermost surface of the imprint template.

18. The apparatus according to claim 15, wherein the gas bearing is controllable to move the imprint template when held by the template holder between an imprint position in which the imprint template applies a pattern to imprintable material on the substrate, and a disengaged position in which the imprint template does not apply a pattern to the imprintable material.

19. The apparatus according to claim 15, wherein the high pressure channel is porous.

* * * * *